(12) United States Patent
Kashyap et al.

(10) Patent No.: US 8,765,524 B2
(45) Date of Patent: Jul. 1, 2014

(54) METHOD AND SYSTEM FOR TRANSIENT VOLTAGE SUPPRESSORS

(71) Applicant: General Electric Company, Schenectady, NY (US)

(72) Inventors: Avinash Srikrishnan Kashyap, Niskayuna, NY (US); David Mulford Shaddock, Troy, NY (US); Emad Andarawis Andarawis, Ballston Lake, NY (US); Peter Micah Sandvik, Niskayuna, NY (US); Stephen Daley Arthur, Glenville, NY (US); Vinayak Tilak, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/967,886

(22) Filed: Aug. 15, 2013

(65) Prior Publication Data

US 2013/0328064 A1     Dec. 12, 2013

Related U.S. Application Data

(62) Division of application No. 13/281,638, filed on Oct. 26, 2011, now Pat. No. 8,530,902.

(51) Int. Cl.
*H01L 21/00*     (2006.01)
(52) U.S. Cl.
USPC .................................. 438/105; 257/76
(58) Field of Classification Search
USPC .................................. 438/105; 257/76
See application file for complete search history.

(56) References Cited

U.S. PATENT DOCUMENTS

| | | | |
|---|---|---|---|
| 3,398,334 | A | 8/1968 | Shockley |
| 5,245,412 | A | 9/1993 | Clark et al. |
| 6,015,999 | A | 1/2000 | Yu et al. |
| 6,489,660 | B1 | 12/2002 | Einthoven et al. |
| 6,689,669 | B2 | 2/2004 | Kurtz et al. |

(Continued)

FOREIGN PATENT DOCUMENTS

| | | |
|---|---|---|
| CN | 101425519 A | 5/2009 |
| CN | 101552465 A | 10/2009 |

(Continued)

OTHER PUBLICATIONS

Peter J. Kannam, "Design Concepts of High Energy Punchthrough Structures," IEEE Transactions on Electron Devices, vol. Ed. 23, No. 8, Aug. 1976, pp. 879-882.

(Continued)

*Primary Examiner* — Douglas Menz
(74) *Attorney, Agent, or Firm* — John P. Darling (57) ABSTRACT

A method of forming a silicon carbide transient voltage suppressor (TVS) assembly and a system for a transient voltage suppressor (TVS) assembly are provided. The TVS assembly includes a semiconductor die in a mesa structure that includes a first layer of a first wide band gap semiconductor having a conductivity of a first polarity, a second layer of the first or a second wide band gap semiconductor having a conductivity of a second polarity coupled in electrical contact with the first layer wherein the second polarity is different than the first polarity. The TVS assembly also includes a third layer of the first, the second, or a third wide band gap semiconductor having a conductivity of the first polarity coupled in electrical contact with the second layer. The layer having a conductivity of the second polarity is lightly doped relative to the layers having a conductivity of the first polarity.

7 Claims, 11 Drawing Sheets

(56) References Cited

U.S. PATENT DOCUMENTS

| | | |
|---|---|---|
| RE38,608 E | 10/2004 | Yu et al. |
| 6,867,436 B1 | 3/2005 | Matteson et al. |
| 6,900,108 B2 | 5/2005 | Kurtz et al. |
| 7,361,942 B1 | 4/2008 | Matteson et al. |
| 7,391,057 B2 | 6/2008 | Ryu et al. |
| 7,510,903 B1 | 3/2009 | Matteson et al. |
| 7,532,445 B2 | 5/2009 | Rana |
| 7,668,295 B2 | 2/2010 | Tang et al. |
| 2003/0084748 A1 | 5/2003 | Kurtz et al. |
| 2003/0211706 A1 | 11/2003 | Kurtz et al. |
| 2004/0012034 A1 | 1/2004 | Ducreux |
| 2006/0181822 A1 | 8/2006 | Rana et al. |
| 2006/0261345 A1 | 11/2006 | Ryu et al. |
| 2008/0285716 A1 | 11/2008 | Tang et al. |
| 2009/0015978 A1 | 1/2009 | Clark |
| 2009/0115018 A1 | 5/2009 | Mallikarjunaswamy |
| 2009/0250720 A1 | 10/2009 | Saucedo-Flores et al. |
| 2009/0267082 A1 | 10/2009 | Yamamoto et al. |
| 2010/0237356 A1 | 9/2010 | Haney et al. |
| 2010/0276779 A1 | 11/2010 | Guan et al. |
| 2011/0058299 A1 | 3/2011 | Simi |

FOREIGN PATENT DOCUMENTS

| | | |
|---|---|---|
| EP | 1456926 A1 | 9/2004 |
| EP | 1883972 A1 | 2/2008 |
| JP | 2008282813 A | 11/2008 |
| JP | 2008541478 A | 11/2008 |
| WO | 02095831 A1 | 11/2002 |
| WO | 03052898 A1 | 6/2003 |
| WO | 2006124107 A1 | 11/2006 |
| WO | 2008014391 A2 | 1/2008 |
| WO | 2009008959 A1 | 1/2009 |
| WO | 2010107510 A1 | 9/2010 |

OTHER PUBLICATIONS

Hagler et al., "SiC Die Attach Metallurgy and Processes for Applications up to 500° C," IEEE Transactions on Components, Packaging and Manufacturing Technology, vol. 1, No. 4, Apr. 2011, pp. 630-639.

European Search Report and Written Opinion issued in connection with corresponding EP Application No. 12189922.3-1555 dated Mar. 7, 2014.

METHOD AND SYSTEM FOR TRANSIENT VOLTAGE SUPPRESSORS

CROSS-REFERENCE TO RELATED APPLICATIONS

This application is a division of U.S. patent application Ser. No. 13/281,638, Avinash Srikrishnan Kashyap et al., entitled "Method and system for transient voltage suppressors," which patent application is incorporated by reference herein in its entirety.

BACKGROUND

The disclosure relates generally to high temperature semiconductor devices, and more specifically, to semiconductor devices for transient voltage suppression in high temperature environments.

Although silicon devices have been used for preventing sensitive electronics coupled in parallel to the TVS device from being subjected to voltage spikes caused by, for example, lightning strikes and being damaged, they are not suitable for high temperature operation. Silicon devices tend to leak higher current as temperature increases, with the current reaching unacceptably high values in ambient temperatures greater than approximately 150° C., which makes them unsuitable to be used in ambient temperatures of 225° C. or more needed for aviation applications requiring core engine-mounted electronics such as distributed engine control. Moreover, known TVS devices typically are packaged using epoxy encapsulation. Epoxy packaging tends to induce large thermal strains within the TVS device structure above approximately 185° C. and to begin to decompose.

Turbine engine instrumentation for both aviation and power generation applications often require expensive cooling, or moving the electronics further away from the sensors and actuators resulting in increased installation and wiring complexity and reduced sensor performance due to noise. The electronics used in distributed controls in the aircraft are subject to damage from voltage surges caused by lightning strikes and electromagnetic interference (EMI). At least some known applications use transient voltage suppression (TVS) devices, which may include features similar to a Zener diode. Commercially available TVS devices made of silicon are unable to be used to protect distributed electronics placed close to the engine core due to the high ambient temperatures they would be exposed to.

BRIEF DESCRIPTION

In one embodiment, a transient voltage suppressor (TVS) assembly includes a semiconductor die in a mesa structure that includes a substrate including a layer of a first wide band gap semiconductor having a conductivity of a first polarity, a second layer of the first or a second wide band gap semiconductor having a conductivity of a second polarity coupled in electrical contact with the substrate, the second polarity being different than the first polarity, and a third layer of the first, the second, or a third wide band gap semiconductor having a conductivity of the first polarity coupled in electrical contact with the second layer. The layer having a conductivity of the second polarity is lightly doped relative to the layers having a conductivity of the first polarity. The TVS assembly also includes a first electrode coupled in electrical contact with the substrate and a second electrode coupled in electrical contact with the third layer. When a voltage greater than a predetermined magnitude is applied across the first and second electrodes, the TVS assembly operates in a punch-though mode that permits a relatively large amount of current to flow through the TVS assembly.

In another embodiment, a method of forming a silicon carbide transient voltage suppressor (TVS) assembly includes providing a punch-through silicon carbide semiconductor transient voltage suppressor die that includes a first side and an opposite second side, encapsulating the die in a glass housing at least partially surrounding the die, and coupling a respective electrode in electrical communication with each of the first and the second sides, each electrode having a coefficient of thermal expansion that substantially matches a coefficient of thermal expansion of the glass housing.

In yet another embodiment, a high temperature electronic system including an electronics unit configured for exposure to an environment having a temperature greater than approximately 150.0° C., the remote electronics unit including a transient voltage suppressor (TVS) assembly coupled in operative relationship with at least some electronic components of the electronics unit, the TVS including a punch-through silicon carbide semiconductor TVS die encapsulated in a glass housing at least partially surrounding the die, and coupled to electrodes using at least one of a thermocompression bond, a transient liquid phase solder bond, a diffusion bond, and an alloyed layer.

BRIEF DESCRIPTION OF THE DRAWINGS

These and other features, aspects, and advantages of the present technique will become better understood when the following detailed description is read with reference to the accompanying drawings in which like characters represent like parts throughout the drawings, wherein.

DETAILED DESCRIPTION

The following detailed description illustrates embodiments of the system by way of example and not by way of limitation. It is contemplated that the systems and methods have general application to electronic component manufacturing and packaging in power electronics, signal electronics, and electromagnetic interference (EMI) protection in industrial, commercial, and residential applications.

As used herein, an element or step recited in the singular and preceded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Embodiments of the present disclosure demonstrate a semiconductor based TVS device that operates reliably at 300° C. In one embodiment, the device is fabricated from silicon carbide (SiC). In other embodiments, the devices are fabricated from other wide band gap materials such as, but not limited to, gallium nitride (GaN), diamond, aluminum nitride (AlN), boron nitride (BN), and combinations thereof. The wide band gap semiconductor TVS device is reliably operable up to approximately 500° C., however, other components, such as, the TVS packaging may be more limiting in the example embodiments. The TVS is a clamping device, suppressing approximately all over-voltages above its breakdown voltage. The TVS device typically comprises three SiC layers (N-P-N). In other embodiments, the three layers comprise P-N-P layers. In an N-P-N type device, when the device is subjected to a potential across the two N layers, a depletion layer is formed (mostly) in the P layer because its doping is much lower compared to the two N layers. For example, one to five orders of magnitude lower, or one-tenth to one ten-thousandth of the dopant concentration of the N layers. For a further example, if the doping concentration in the N layers is approximately $10^{18}/cm^3$, the doping concentration in the P layers would be approximately $10^{15}/cm^3$. As the voltage across the device is increased, the depletion region extends all across the P layer and touches the N layer on the other side. This leads to a condition known as "punch-through" and a large amount of current begins flowing in the device. The device is able to maintain this condition with minimal change in the voltage across it. A similar explanation describes the operation when the polarity of the layers is changed to P-N-P.

The package, in one example, is designed to have a low inductance and capacitance to provide fast electrical response and to have a thermal capacitance to manage thermal pulses. The low inductance and capacitance is achieved by using short conduction paths from the die to the termination which is bonded to the circuit. Glass or ceramic encapsulation may be used to protect the die from contamination in the environment and provide improved electrical insulation across the device. A borosilicate glass encapsulation has been found to have low leakage current in testing up to 600° C. The termination material is selected to be compatible with ceramic-to-metal sealing and with glass-to-metal sealing, respectively. The termination material may include but is not limited to tungsten, molybdenum, or Kovar®. The die is bonded on both sides to respective terminations using for example, a thermocompression bond, transient liquid phase solder bond, diffusion bond, or alloyed layer. In one embodiment, a gold thermocompression bond provides a lower thermal resistance path and does not oxidize in high temperature. Gold also has a large plastic range to provide a low stress interface especially at high temperatures.

The TVS device facilitates preventing sensitive electronics coupled in parallel to the TVS device from being subjected to voltage spikes caused by, for example, lightning strikes and being damaged. In various embodiments, more than one TVS device may be connected in a TVS assembly comprising parallel, series, and/or series parallel configurations of TVS devices to permit enhanced electrical protective features of the TVS assembly, for example, greater voltage or current capabilities. The SiC device in a high temperature package enables its deployment in environments with relatively high ambient temperatures, for example, greater than approximately 150° C. Moreover, the SiC device provides ultra-rigid clamping. Although described herein as being suitable for use in high temperature applications, the wide band gap materials are also well suited for applications where the temperature is not relatively high, for example, at room temperature.

Figure 1:
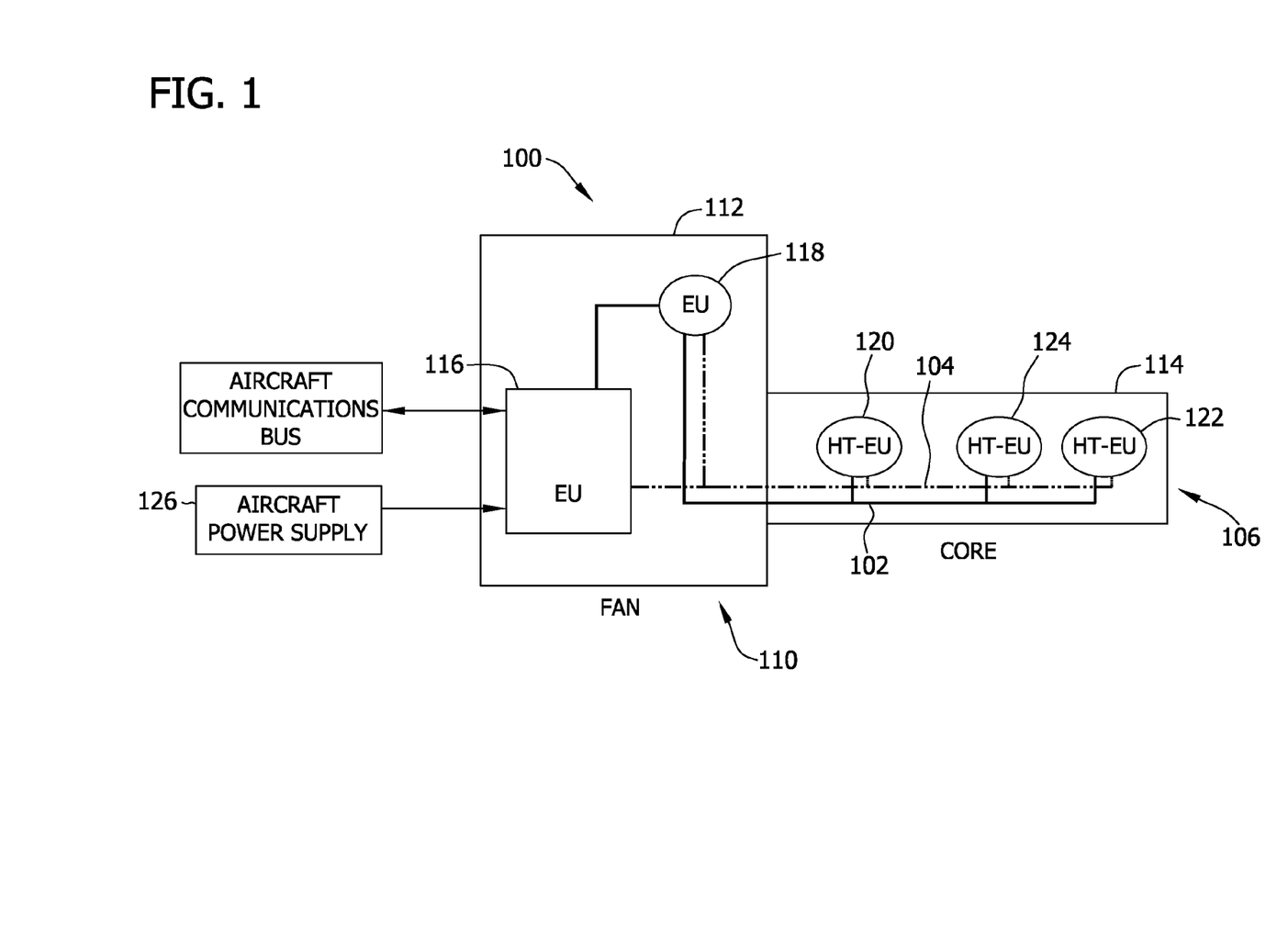
FIG. 1 is a schematic block diagram of an architecture of a power and communication distribution system in accordance with an exemplary embodiment of the present invention.

FIG. 1 is a schematic block diagram of an architecture of a power and communication distribution system 100 in accordance with an exemplary embodiment of the present invention. In the exemplary embodiment, distribution system 100 includes a power supply distribution bus 102 and a communications channel 104. Power supply distribution bus 102 distributes electrical power to a plurality of electronics units 106 located about an engine 110, in the exemplary embodiment. In the exemplary embodiment, engine 110 is a gas turbine engine comprising a fan 112 and a core engine 114. In various other embodiments, engine 110 may be another piece of machinery, such as, but not limited to, a piston-driven internal combustion engine, a compressor, a generator, and a pump. In the exemplary embodiment, plurality of electronics units 106 include electronics units (EU) 116 and 118 illustrated as being mounted in a relatively cool environment proximate fan 112 of, for example, a gas turbine engine (GTE) 110. Distribution system 100 also includes high temperature electronics units (HT-EU) 120, 122, and 124. Each of HT-EUs 120, 122, and 124 are illustrated as being mounted on core engine 114 of gas turbine engine 110, which is a relatively hot environmental location. For example, a temperature in a vicinity of a core housing 114 may be greater than approximately 150.0° Celsius (C) to approximately 300.0° C.

EU 116 receives power from a power supply 126. The received power is managed for distribution within distribution system 100 by EU 116. The managed power is transmitted to various respective loads including EUs 118, HT-EUs 120, 122 and 124 through power bus power supply distribution bus 102. Similarly, communications among the various electronic units is transmitted over communications channel 104.

During operation, electromagnetic interference and/or lighting strikes to the aircraft may induce large transient voltages spikes onto buses 102 and/or 104. Such large voltage spikes, if not remediated, may cause damage to electrical and electronic components coupled to the buses including EUs 116, 118, and HT-EUs 120, 122, and 124. To avoid such damage, transient voltage suppressors may be used in series and/or parallel with selected components and/or circuits within components to facilitate reducing and/or eliminating such spikes. One method clamps the voltage on the bus to a predetermined level.

Figure 2:
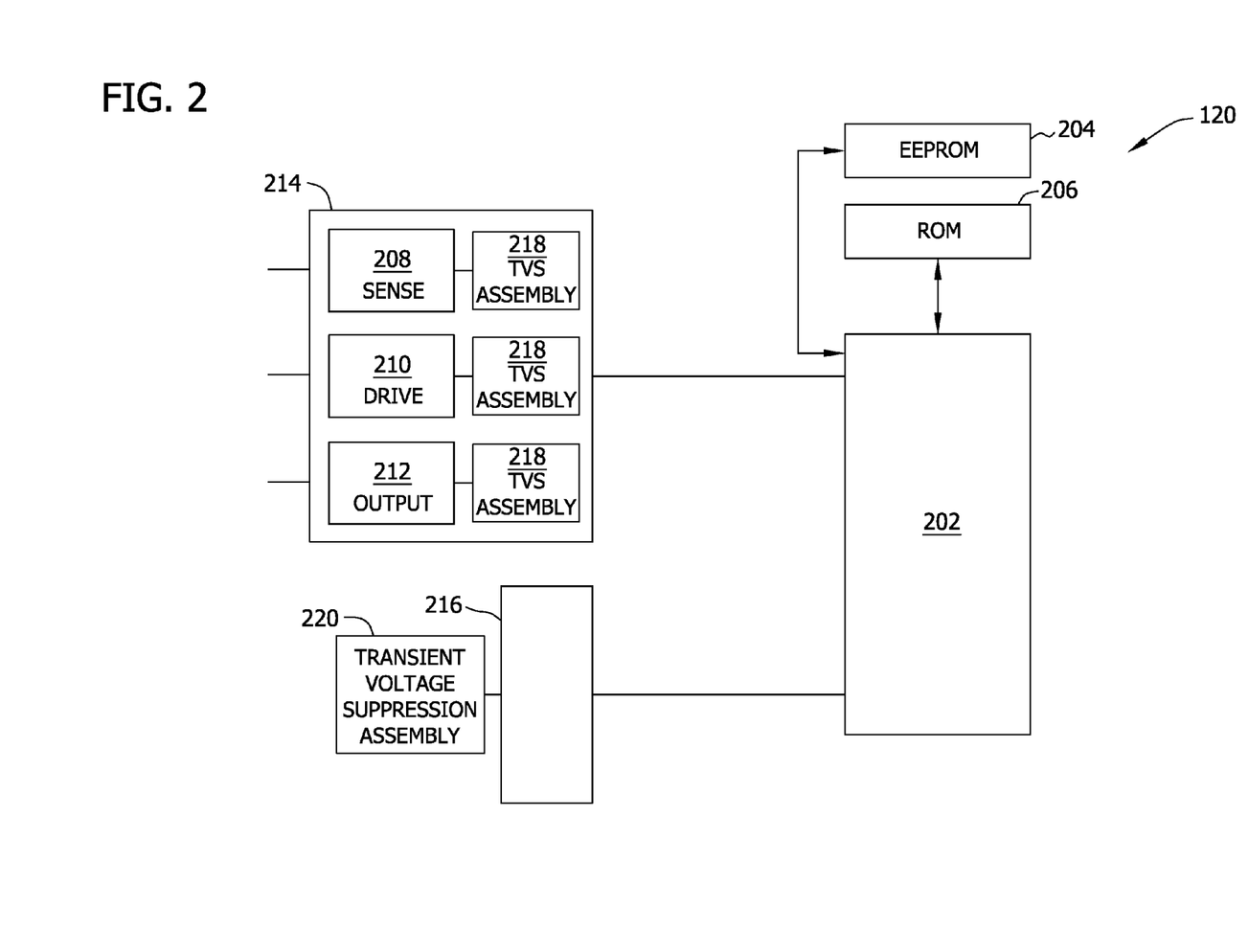
FIG. 2 is a schematic block diagram of an exemplary one of the electronics units shown in FIG. 1 in accordance with an exemplary embodiment of the present system.

FIG. 2 is a schematic block diagram of an exemplary one of EUs 116, 118, and HT-EUs 120, 122, and 124 in accordance with an exemplary embodiment of the present system. In the exemplary embodiment, HT-EU 120, for example, includes a processor 202, a memory 204 communicatively coupled to processor 202, a ROM memory 206, an input section 208, also communicatively coupled to processor 202, a drive module 210, and an output module 212. HT-EU 120 also includes a communications module 214 communicatively coupled to communications bus 104 and processor 202. HT-EU 120 further includes a power module 216 electrically coupled to power supply distribution bus 102 and configured to distribute power at various voltages throughout HT-EU 120. Being coupled to respective buses, communications module 214 and power module 216 are susceptible to EMI and/or lightning induced spikes. To prevent such interference and spikes from reaching communications module 214 and power module 216 and downstream components, one or more transient voltage suppression (TVS) assemblies 218 and 220 are coupled between the respective buses and communications module 214 and power module 216.

Figure 3A:
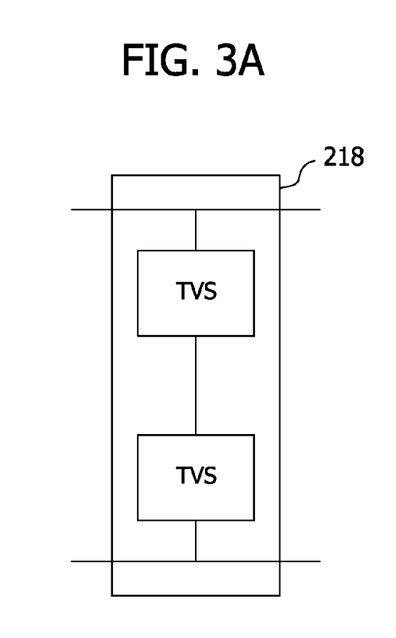
FIGS. 3A-3C are schematic block diagrams of various configurations of voltage suppression protection available using TVS 218 in accordance with an exemplary embodiment of the present invention.
Figure 3B:
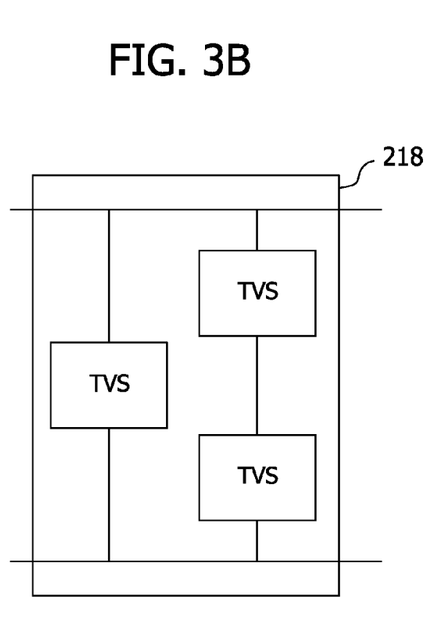
Figure 3C:
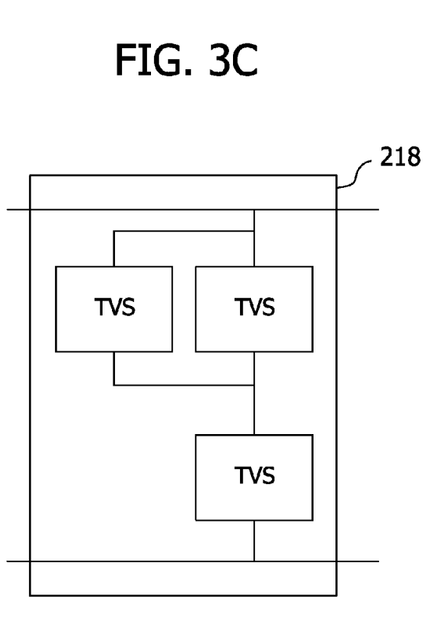

FIGS. 3A-3C are schematic block diagrams of various configurations of voltage suppression protection available using TVS assembly 218 in accordance with an exemplary embodiment of the present invention. In the embodiment of FIG. 3A, TVS assembly 218 comprises two transient voltage suppressors in a series configuration. In the embodiment of FIG. 3B, TVS assembly 218 comprises two transient voltage suppressors in a series configuration in parallel with a third transient voltage suppressor. In the embodiment of FIG. 3C, TVS assembly 218 comprises two transient voltage suppressors in a parallel configuration in series with a third transient voltage suppressor. Various other combinations of individual transient voltage suppressors maybe assembled to provide sufficient current carrying capacity and a predetermined voltage performance for many different applications.

Figure 4:
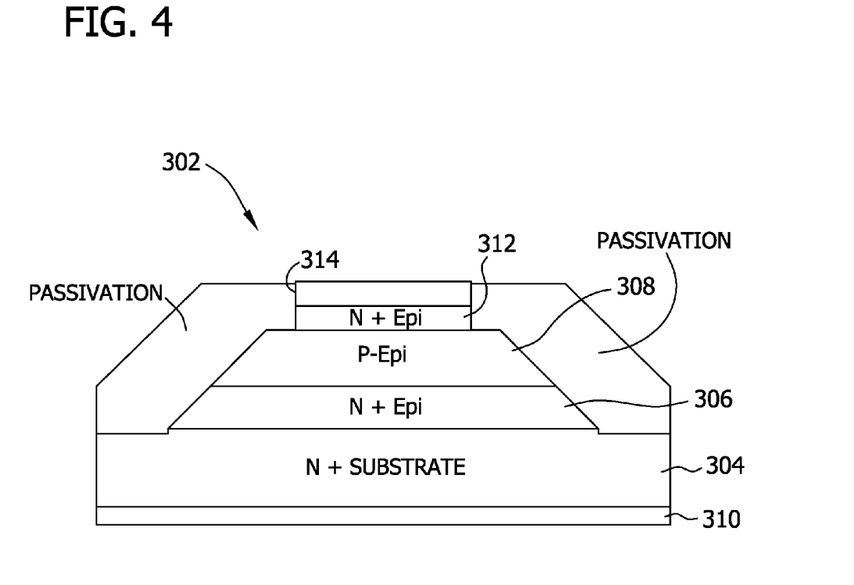
FIG. 4 is a side elevation view of a semiconductor die portion of a transient voltage suppression (TVS) assembly shown in FIG. 2 in accordance with an exemplary embodiment of the present system.

FIG. 4 is a side elevation view of a semiconductor die 302 portion of a transient voltage suppression (TVS) assembly 218 or 220 (shown in FIG. 2) in accordance with an exemplary embodiment of the present system. In the exemplary embodiment, die 302 includes a mesa structure that is formed of a substrate 304 of for example, silicon carbide having an n+ type conductivity and an epitaxially grown n+ type conductivity layer 306, an epitaxially grown p− layer 308 coupled in electrical contact with layer 306, and an epitaxially grown n+ layer 312 coupled in electrical contact with p− layer 308. In the exemplary embodiment, P− layer 308 is relatively lightly doped relative to the n+ layers 306 and 308. A uniform doping concentration of substrate 304 and layers 306, 308, and 312 improves a uniformity of the electric field distribution in the depletion region, thereby improving the breakdown voltage characteristic. Moreover, the mesa structure has a beveled sidewall angled approximately five degrees to approximately eighty degrees with respect to an interface between adjacent contacting layers to reduce the maximum electric field profile at a surface of the die. A first electrical contact 310 is coupled in electrical contact with substrate 304. A second electrical contact 314 is coupled in electrical contact with epitaxially grown n+ layer 312. Semiconductor die 302 portion of a transient voltage suppression (TVS) assembly 218 or 220 operates using "punch-through," or also known as, "reach-through" physics such that as the voltage across die 302 is increased, a depletion region extends all across P− layer 308 and touches n+ layers 306 and 312. This leads to a condition known as "punch-through" and large amounts of current are able to flow through die 302. Die 302 is able to maintain this condition with minimal change in the voltage across it.

In various embodiments, TVS assembly 218 is sized and formed to ensure a maximum electric field internal to the semiconductor material of die 302 is maintained less than two megavolts per centimeter. Additionally, TVS assembly 218 is configured to maintain an increase in blocking voltage of less than 5% for current in a range of less than approximately 1.0 nanoamp to approximately 1.0 milliamp. As used herein, blocking voltage refers to the highest voltage at which TVS assembly 218 does not conduct or is still in an "off" state. Moreover, TVS assembly 218 is configured to maintain an electrical leakage current of less than approximately 1.0 microamp up to approximately the punch-through voltage of TVS assembly 218 at room temperature and less than 1.0 microamp up to approximately the punch-through voltage at operating temperatures of up to 225° Celsius.

In various embodiments, TVS assembly 218 is configured to exhibit punch through characteristics between approximately 5.0 volts to approximately 75.0 volts. In various other embodiments, TVS assembly 218 is configured to exhibit punch through characteristics between approximately 75.0 volts to approximately 200.0 volts. In still other embodiments, is configured to exhibit punch through characteristics greater than approximately 200 volts.

Figure 5:
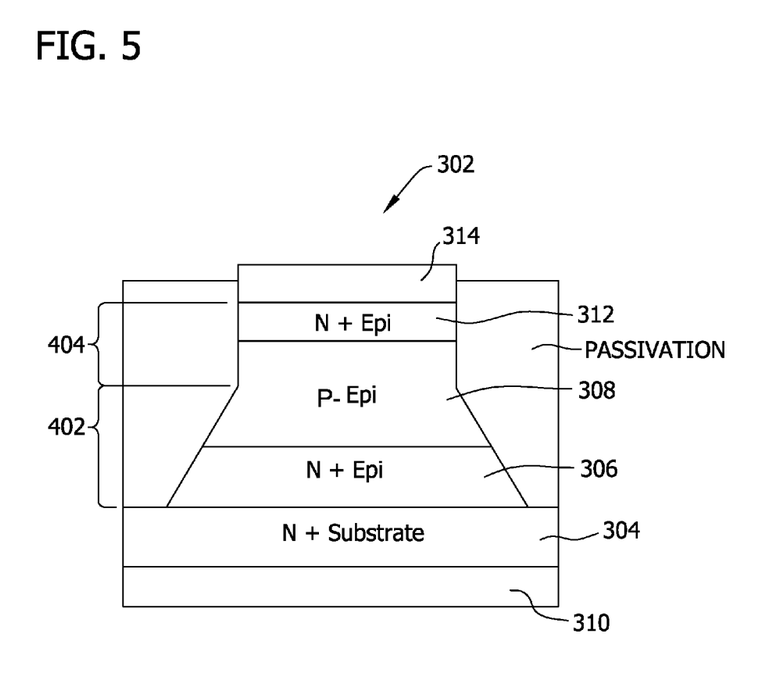
FIG. 5 is a side elevation view of the semiconductor die portion of the transient voltage suppression (TVS) assembly shown in FIG. 2 in accordance with another embodiment of the present system.

FIG. 5 is a side elevation view of semiconductor die 302 portion of a transient voltage suppression (TVS) assembly 218 or 220 (shown in FIG. 2) in accordance with another embodiment of the present system. In the exemplary embodiment, die 302 includes a first frusto-conical structure 402 and a second substantially cylindrical structure 404. First frusto-conical structure 402 is formed of epitaxially grown n+ type conductivity layer 306 and at least a portion of epitaxially grown p− layer 308. Cylindrical structure 404 is formed of at least a portion of epitaxially grown p− layer 308 and epitaxially grown n+ layer 312. In the exemplary embodiment, p− layer 308 is relatively lightly doped relative to n+ layers 306 and 312. Uniform doping concentration of substrate 304 and layers 306, 308, and 312 improves a uniformity of the electric field distribution in the depletion region, thereby improving the breakdown voltage characteristic. A first electrical contact 310 is coupled in electrical contact with substrate 304. A second electrical contact 314 is coupled in electrical contact with epitaxially grown n+ layer 312.

Figure 6:
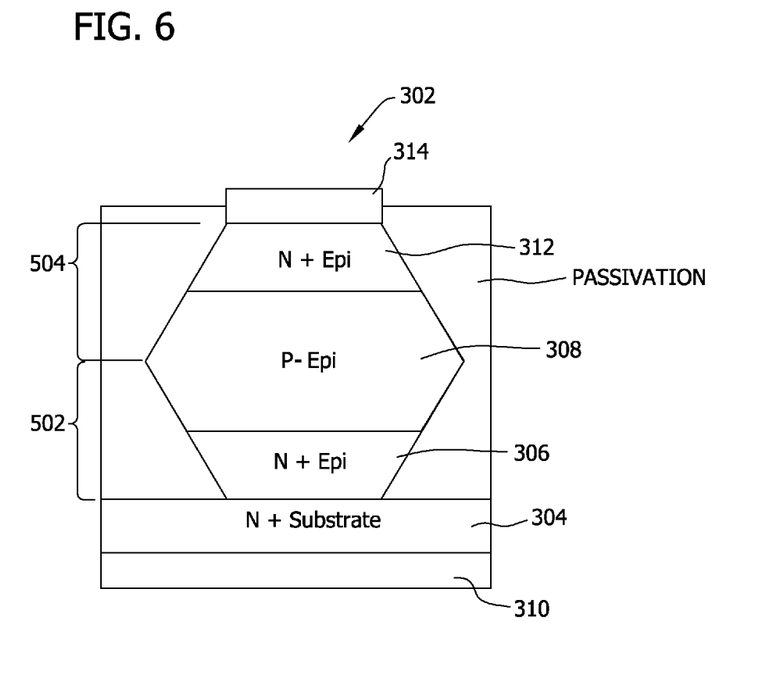
FIG. 6 is a side elevation view of the semiconductor die portion of the transient voltage suppression (TVS) assembly shown in FIG. 2 in accordance with another embodiment of the present system.

FIG. 6 is a side elevation view of semiconductor die 302 portion of a transient voltage suppression (TVS) assembly 218 or 220 (shown in FIG. 2) in accordance with another embodiment of the present system. In the exemplary embodiment, die 302 includes a first frusto-conical structure 602 and a second frusto-conical structure 604. First frusto-conical structure 602 is formed of epitaxially grown n+ type conductivity layer 306 and at least a portion of epitaxially grown p− layer 308. Second frusto-conical structure 604 is formed of at least a portion of epitaxially grown p− layer 308 and epitaxially grown n+ layer 312. In the exemplary embodiment, p− layer 308 is relatively lightly doped relative to n+ layers 304, 306, and 312. Uniform doping concentration of substrate 304 and layers 306, 308, and 312 improves a uniformity of the electric field distribution in the depletion region, thereby improving the breakdown voltage characteristic. A first electrical contact 310 is coupled in electrical contact with substrate 304. A second electrical contact 314 is coupled in electrical contact with epitaxially grown n+ layer 312.

Figure 7:
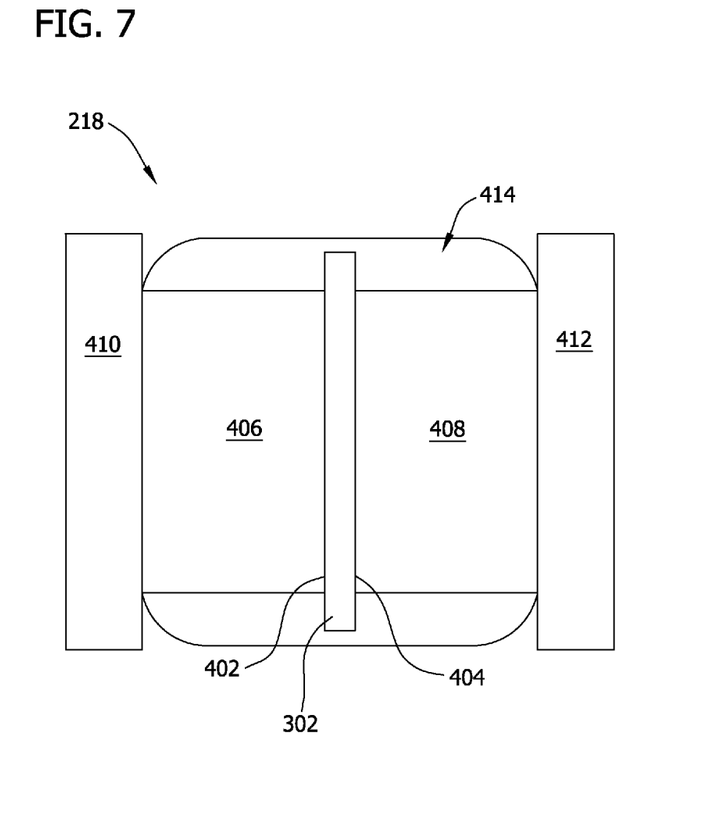
FIG. 7 is a side view of the transient voltage suppression (TVS) assembly shown in FIG. 2 in accordance with an exemplary embodiment of the present invention.

FIG. 7 is a side view of transient voltage suppression (TVS) assembly 218 (shown in FIG. 2) in accordance with an exemplary embodiment of the present invention. In the exemplary embodiment, first and second electrical contacts 310 and 314 each includes a diffusion bonded or alloyed layer 702 and 704 and a respective header pin 406 and 408. In various embodiments, layers 702 and 704 are formed of copper (Cu), gold (Au), aluminum (Al), platinum (Pt) and combinations thereof. In other embodiments, layers 702 and 704 may be formed of other materials, combinations or alloys. In various embodiments, first and second electrical contacts 310 and 314 are coupled to die 302 using layers 702 and 704 using, for example, but not limited to, a thermocompression bond, a transient liquid phase solder bond, a diffusion bond, or an alloyed layer. Surface mount contacts 410 and 412 are coupled in electrical contact with first and second electrical contacts 310 and 314, typically to header pins 406 and 408 respectively. A glass encapsulation 414 at least partially surrounds die 302 and first and second electrical contacts 310 and 314. In various embodiments, glass encapsulation 414 includes borosilicate glass or an alumina ceramic. Header pins 406 and 408 are formed from a material selected to have a coefficient of thermal expansion that substantially matches a coefficient of thermal expansion of glass encapsulation 414. Such materials may include at least one of tungsten, molybdenum, an iron-nickel-cobalt, low expansion alloy, sometimes referred to as Kovar® and a combination thereof. Kovar® alloy is a vacuum melted, iron-nickel-cobalt, low or controlled expansion alloy whose chemical composition is controlled within narrow limits to assure precise uniform thermal expansion properties. In the exemplary embodiment, header pins 406 and 408 are formed from a material comprising approximately 29% nickel (Ni), 17% cobalt (Co) and the remaining balance is substantially iron (Fe).

Figure 8:
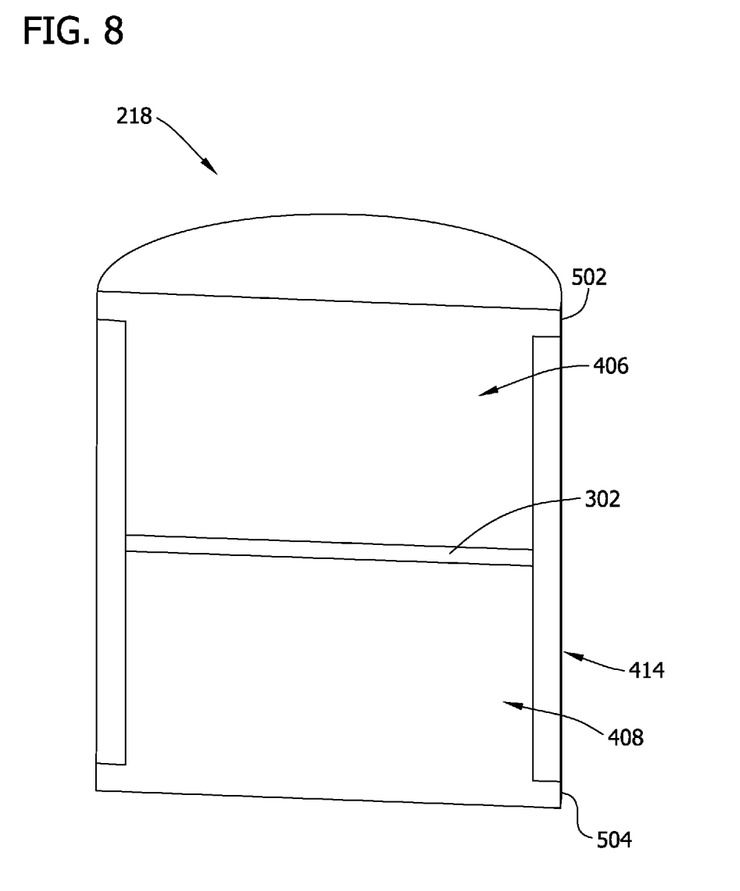
FIG. 8 is another view of the transient voltage suppression (TVS) assembly shown in FIG. 2 in accordance with an exemplary embodiment of the present system.

FIG. 8 is another view of transient voltage suppression (TVS) assembly 218 (shown in FIG. 2) in accordance with an exemplary embodiment of the present system. In the exemplary embodiment, header pins 406 and 408 are formed having flanges 502 and 504 configured to mate with glass encapsulation 414 and to receive, for example, a solder connection to electrically couple TVS assembly 218 to a circuit.

Figure 9:
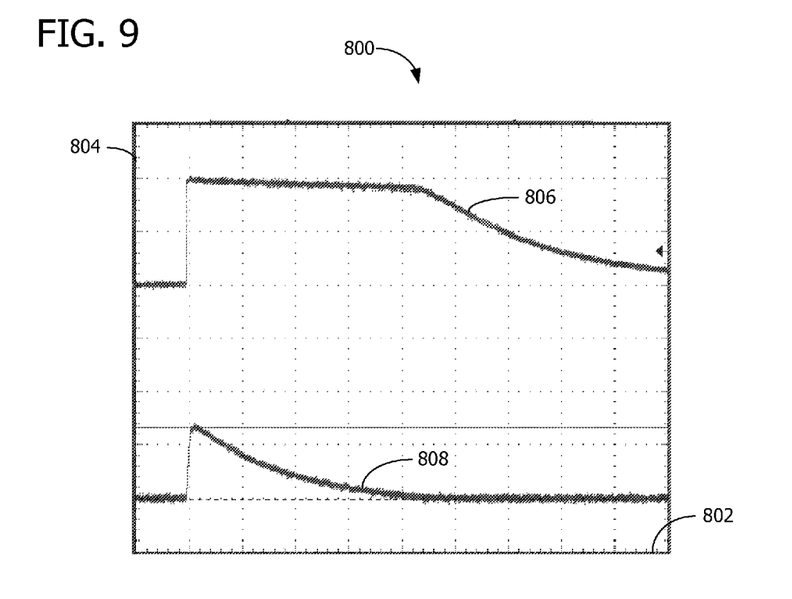
FIG. 9 is a graph 800 illustrating results of a lightning test waveform of the TVS assembly.

FIG. 9 is a graph 800 illustrating a lightning test waveform of TVS assembly 218. In the exemplary embodiment, graph 800 includes an x-axis 802 graduated in units of time and a y-axis 804 graduated in units of voltage and current. A trace 806 represents a voltage imposed on TVS assembly 218, the peak of which points to the clamping voltage of TVS assembly 218. In the exemplary embodiment, it is approximately 100.0 Volts. A trace 808 represents a current flowing through TVS assembly 218, which is approximately 134 Amperes.

Figure 10:
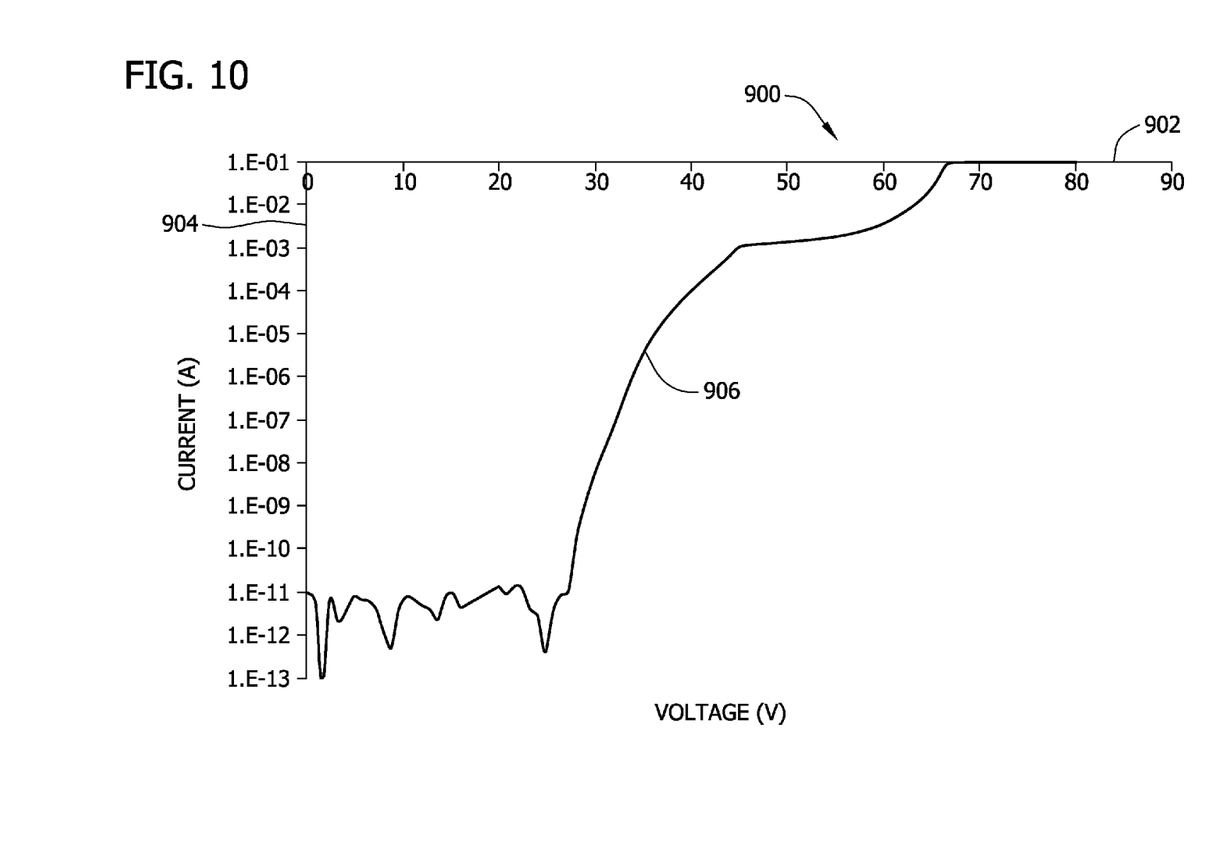
FIG. 10 is a graph 900 illustrating results of a DC test of the TVS assembly.

FIG. 10 is a graph 900 illustrating a DC test. In the exemplary embodiment, graph 900 includes an x-axis 902 graduated in units of voltage and a y-axis 904 graduated in units of current using a logarithmic scale. A trace 906 represents a response of TVS assembly 218 when subjected to a voltage across first and second electrical contacts 310 and 312 and a corresponding current is measured. The DC test is performed with TVS assembly 218 at approximately 200° Celsius to determine a high temp capability of TVS assembly 218. In the exemplary embodiment, TVS assembly 218 turns on at approximately 65.0 Volts where trace 906 goes flat. At voltages less than 65.0 Volts TVS assembly 218 is in an "off" condition. The current flowing when TVS assembly 218 is off is the leakage current. It can be seen that the leakage current values through TVS assembly 218 are extremely small, for example, in the pico-ampere range) when TVS assembly 218 is off at high temperature indicating low leakage currents.

Figure 11:
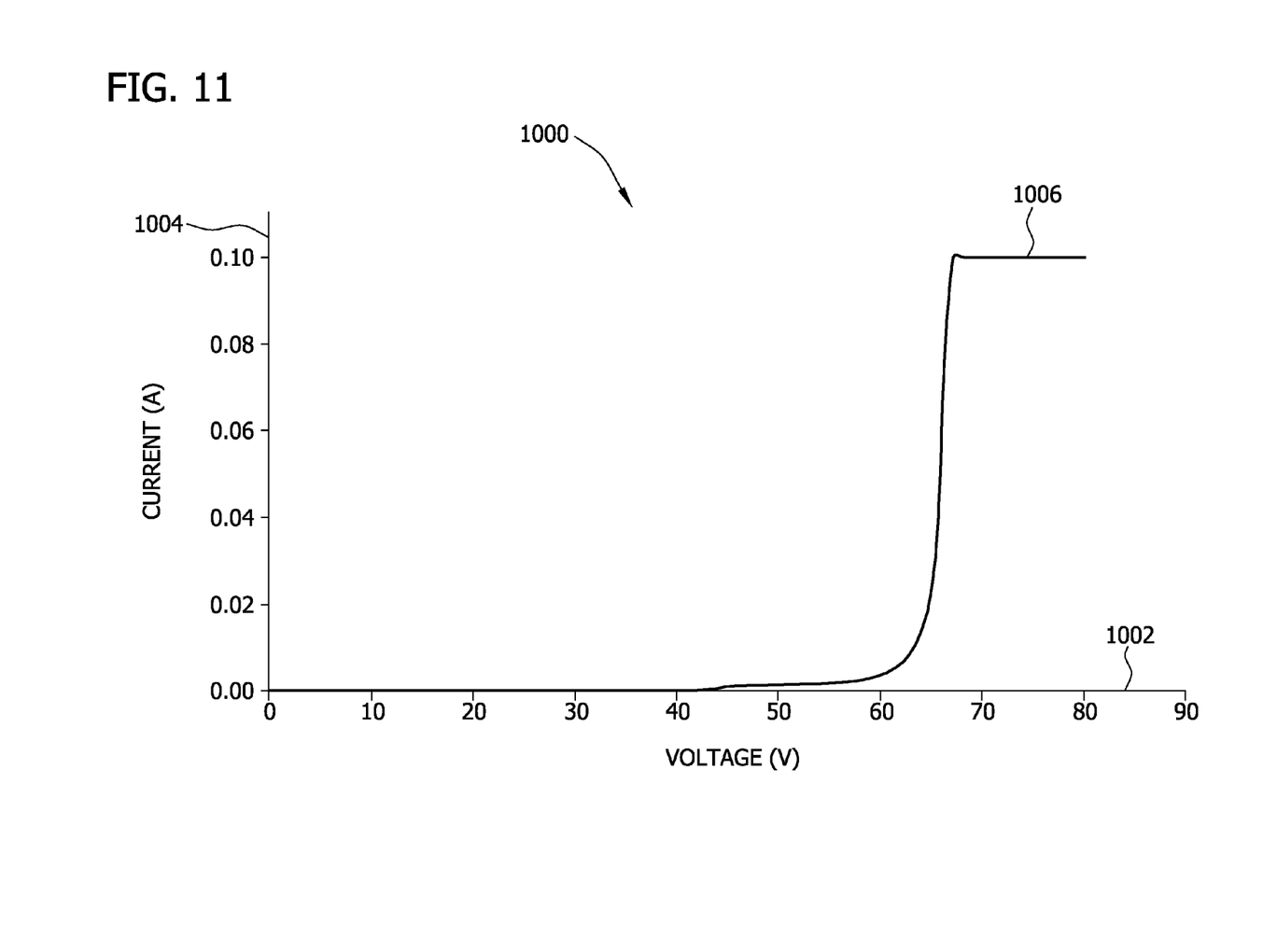
FIG. 11 is a graph 1000 illustrating results of the DC test shown in FIG. 9 of the TVS assembly.

FIG. 11 is a graph 1000 illustrating a DC test of TVS 218. In the exemplary embodiment, graph 1000 includes an x-axis 1002 graduated in units of voltage and a y-axis 1004 graduated in units of current using a linear scale. A trace 1006 represents a response of TVS assembly 218 when subjected to a voltage across first and second electrical contacts 310 and 312 and a corresponding current is measured. The DC test is performed with TVS assembly 218 at approximately 200° Celsius to determine a high temp capability of TVS assembly 218. In the exemplary embodiment, TVS assembly 218 turns on at approximately 65.0 Volts where trace 906 breaks sharply.

The above-described embodiments of a method and system of transient voltage suppression provides a cost-effective and reliable means for reducing and/or eliminating voltage spikes induced into electrical systems such as from EMI and/or lightning strikes. More specifically, the methods and systems described herein facilitate operation of electronic equipment subject to relatively high environmental temperatures. In addition, the above-described methods and systems facilitate operating electronic components in high density housings without additional cooling support. As a result, the methods and systems described herein facilitate operating vehicles, such as aircraft in a cost-effective and reliable manner.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of forming a silicon carbide transient voltage suppressor (TVS) assembly, said method comprising:
   providing a punch-through silicon carbide semiconductor transient voltage suppressor die that includes a first side and an opposite second side;
   encapsulating the die in a glass housing at least partially surrounding said die; and
   coupling a respective electrode in electrical communication with each of the first and the second sides, each electrode having a coefficient of thermal expansion that substantially matches a coefficient of thermal expansion of the glass housing.

2. A method in accordance with claim 1 wherein providing the die comprises:
   providing a silicon carbide substrate having a first surface and an opposite second surface;
   diffusing a dopant of a first conductivity type into the substrate forming a silicon carbide layer having a conductivity of a first polarity;
   epitaxially forming a layer having a conductivity of a second polarity over at least a portion of the first surface; and
   epitaxially forming a layer having a conductivity of a first polarity over at least a portion of the lightly doped layer.

3. A method in accordance with claim 2, wherein epitaxially forming a layer of a second conductivity type comprises epitaxially forming a layer of a lightly doped second conductivity type relative to the layers of the first conductivity type.

4. A method in accordance with claim 1, wherein coupling a respective electrode in electrical communication with each of the first and the second sides comprises bonding the respective electrode in electrical communication to each of the first and the second sides using at least one of a thermocompression bond, a transient liquid phase solder bond, a diffusion bond, and an alloyed layer.

5. A method in accordance with claim 1, wherein coupling a respective electrode in electrical communication with each of the first and the second sides comprises bonding the respective electrode in electrical communication to each of the first and the second sides using a gold layer.

6. A method in accordance with claim 1, further comprising coupling surface mount contacts in electrical contact with the respective electrode in electrical communication with each of the first and the second sides.

7. A high temperature electronic system comprising an electronics unit configured for exposure to an environment having a temperature greater than approximately 150.0° C., said remote electronics unit comprising a transient voltage suppressor (TVS) assembly coupled in operative relationship with at least some electronic components of the electronics unit, said TVS comprising a punch-through silicon carbide semiconductor TVS die encapsulated in a glass housing at least partially surrounding said die, and coupled to electrodes using at least one of a thermocompression bond, a transient liquid phase solder bond, a diffusion bond, and an alloyed layer.

* * * * *